United States Patent [19]
Byrne et al.

[11] Patent Number: 5,969,965
[45] Date of Patent: Oct. 19, 1999

[54] SELF-CONTAINED CONVERTER PLANT FOR MODULAR POWER SUPPLY SYSTEMS

[75] Inventors: Vincent M. Byrne, Mesquite; Roosevelt O. Carr, Plano, both of Tex.; Terry L. Inmon, O'Fallon, Mo.

[73] Assignee: Lucent Technologies Inc., Murray Hill, N.J.

[21] Appl. No.: 09/227,663

[22] Filed: Jan. 8, 1999

[51] Int. Cl.$^6$ .............................. H02M 1/00; H05K 5/00
[52] U.S. Cl. ........................................... 363/144; 363/146
[58] Field of Search ................................ 363/141, 144, 363/146, 147; 361/622, 658, 676, 688, 752, 809, 825

[56] References Cited

U.S. PATENT DOCUMENTS

| | | | |
|---|---|---|---|
| 4,794,509 | 12/1988 | Nussbaumer | 363/141 |
| 4,954,940 | 9/1990 | Chandler et al. | 363/146 |
| 4,992,925 | 2/1991 | Meyer | 363/141 |
| 5,835,354 | 11/1998 | Bug et al. | 363/144 |

*Primary Examiner*—Matthew Nguyen

[57] ABSTRACT

The present invention provides a self-contained converter plant for use in a modular power supply system. A modular power supply system includes a chassis having power unit bays each configured to receive a power unit module therein, a power distribution bus, a communications bus and a controller. In one embodiment, the self-contained converter plant comprises a housing having a power input connector configured to engage an electrical power interface on the power distribution bus and a converter communications connector configured to engage a communications interface on the communications bus. The converter plant further comprises a converter, and a power distribution device, all contained in the housing. The power distribution panel is electrically coupled to the converter.

25 Claims, 4 Drawing Sheets

5,969,965

SELF-CONTAINED CONVERTER PLANT FOR MODULAR POWER SUPPLY SYSTEMS

TECHNICAL FIELD OF THE INVENTION

The present invention is directed, in general, to an electrical power converter and, more specifically, to a self-contained power converter for use with modular power supply systems.

BACKGROUND OF THE INVENTION

Modular power supplies and power conversion systems have been available for many years. In most domestic applications, commercial ac electrical power, e.g., 120v/208v/240v, may be fed to multiple rectifiers wired in parallel. The output of the rectifiers is generally a dc voltage, often 24v dc, that is fed to a dc output bus. The parallelism of the rectifiers permits the failure of one rectifier without causing a total system failure. Some applications for modular power supplies, e.g., a cellular telephone power system, may require a second (e.g., 48v dc) or even third voltage for other functions. However, these special applications are limited to a small fraction of the installations in the cellular telephone market. Several conventional approaches to satisfying this need have been made in order to present a single product that addresses applications that require converters, as well as those applications that do not.

In some cases, a shelf has been dedicated to converters. However, this is very expensive in terms of wasted structure and space, as the remainder of the shelf not used for converters is not useable for rectifiers and represents a non-useful sunk cost. Another approach has been to dedicate one or more bays on multipurpose shelves of the system chassis to converters. This approach rigidly defines a specific combination of rectifiers and converters and is inflexible in application. This approach works well only if the specific combination of rectifiers and converters exactly match the application. Of course, if system requirements grow or even change, this approach is not flexible enough to readily compensate for the additional system requirements.

In other cases, a chassis may have multipurpose shelves with bays configured for either rectifiers or converters by installing all wiring and connectors for both Rectifiers and converters at each bay. Again, the additional cost of dually configuring the bays is undesirable. In still another approach, an adapter is made available that is selectively installed in one or more bays of the chassis and is configured to accept one or more converters. In this case, the cost of the converter and adapter is only incurred when a converter is required for a specific application. This approach is especially useful when the secondary or tertiary power required is relatively low as compared to the primary power, which is usually the case in practical applications. However, this system typically requires dedicated wiring between the converters and the system overall controller.

Accordingly, what is needed in the art is a self-contained power converter module that includes control and distribution circuitry and can be quickly inserted into or removed from a modular power supply system without extensive configuration or a separate chassis.

SUMMARY OF THE INVENTION

To address the above-discussed deficiencies of the prior art, the present invention provides a self-contained converter plant for use in a modular power supply system. A modular power supply system includes a chassis having power unit bays each configured to receive a power unit module therein, a power distribution bus, a communications bus and a controller. In one embodiment, the self-contained converter plant comprises a housing having a power input connector configured to engage an electrical power interface on the power distribution bus and a converter communications connector configured to engage a communications interface on the communications bus. The converter plant further comprises a converter, and a power distribution device, all contained in the housing. The power distribution panel is electrically coupled to the converter.

In other embodiments, the power unit module may be a rectifier module, a converter module, or a controller module. In an alternative embodiment, the converter plant further includes a converter control card contained in the housing and electrically coupled to the converter and to the converter communications connector. In another embodiment, the converter is a dc to dc converter. In a particularly advantageous embodiment, a form factor of the converter plant housing substantially duplicates the form factor of the rectifier module, thereby enabling the converter plant to substantially occupy a rectifier bay. The electrical power interface on the power distribution bus, in yet another embodiment, includes a power connector and the communications interface on the communications bus includes a power unit communications connector. In another aspect of this embodiment, the power connector is configured to cooperatively engage the power unit connector and the converter communications connector is configured to cooperatively engage the power unit communications connector.

The converter, in yet other embodiments, may be a step-up voltage converter or a step-down voltage converter. In an additional embodiment, the converter plant also includes a fan module configured to cool the converter.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken in conjunction with the accompanying drawings, in which.

DETAILED DESCRIPTION

Figure 1:
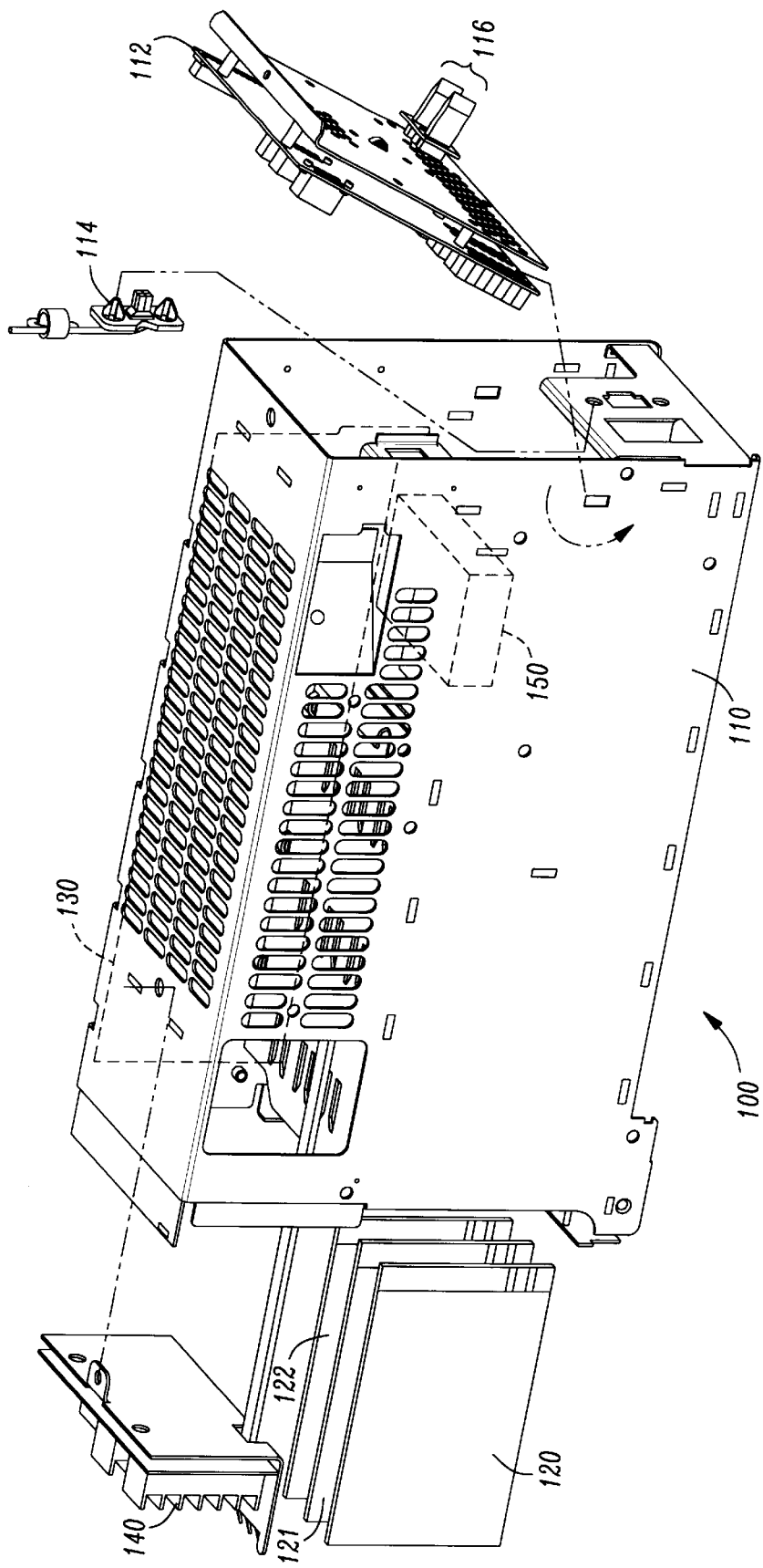
FIG. 1 illustrates an isometric view of one embodiment of a self-contained converter plant constructed according to the principles of the present invention.

Referring initially to FIG. 1, illustrated is an exploded isometric view of one embodiment of a self-contained converter plant constructed according to the principles of the present invention. A self-contained converter plant 100 comprises a housing 110, a converter 120, a converter control card 130, a power distribution panel 140, and a cooling fan 150. The housing 110 includes a backplane 112 with a converter communications connector 114 and a power input connector 116 installed thereon. The converter 120 is electrically coupled to and between the power input connector 116 and the power distribution panel 140. The converter control card 130 is electrically coupled to and between the converter communications connector 114 and the converter 120. However, the function of the converter control card 130 may, in an alternative embodiment, be programmed into a modular power system controller to be described below. The cooling fan 150 is electrically coupled to the power input connector 116.

In a preferred embodiment, the converter 120 is a dc to dc converter that may receive a 24v dc input voltage through the power input connector 116 and output a dc voltage to the power distribution panel 140, e.g., 48v dc. The dc to dc converter may be a step-up or a step-down converter, outputting a dc voltage respectively greater than or less than the 24v dc input voltage. Alternatively, the converter plant 100 may be configured to: (a) receive an ac input voltage and output a dc voltage (rectifier), (b) receive a dc input voltage and output an ac voltage (inverter), or (c) receive a dc input voltage and output ringer voltages (ringer). In alternative embodiments, the converter plant 100 may further comprise additional converters 121, 122. In one embodiment, the additional converters 121, 122 may provide power output of the same voltage as that of the converter 120, thereby providing additional power capacity. In an alternative embodiment, the additional converters 121, 122 may provide power output of a different voltage than that of the converter 120 for other sub-system loads (not shown).

Figure 2A:
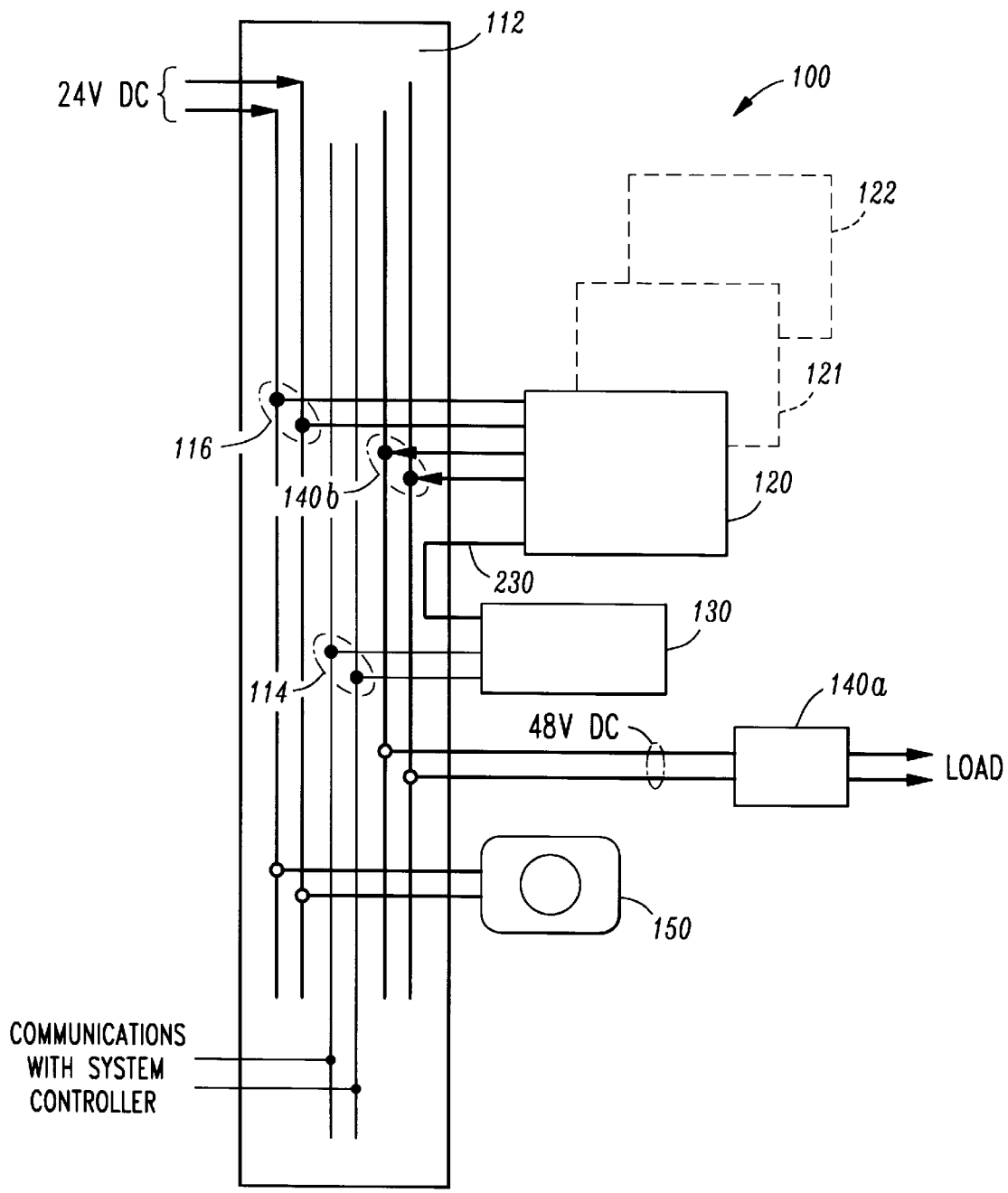
FIG. 2A illustrates a schematic block diagram of one embodiment of the self-contained converter plant of FIG. 1.

Referring now to FIG. 2A, illustrated is a schematic block diagram of one embodiment of the self-contained converter plant of FIG. 1. In one embodiment, the converter plant 100 receives 24v dc input at power input connector 116. However, one who is skilled in the art will recognize that the present invention may also be used with other voltages or power, such as 48v dc or 120v ac. Electrical power is routed through the backplane 112 to converter 120. Communications with a converter control card 130 of a modular power supply system (to be described below) is accomplished through converter communications connector 114. The converter control card 130 is electrically coupled to the converter communications connector 114 and through a local communications link 230 to the converter 120. The converter control card 130 monitors and controls the output of the converter 120. Additional, optional converters 121, 122 may also be accommodated in the housing 110 (FIG. 1). Output power from the converter 120 is routed to an output device, that in one embodiment may be a distribution panel 140a. In an alternative embodiment, the output device may be direct connects 140b on the backplane 112. One who is skilled in the art will readily conceive of other forms of an output device. DC input power also supplies one or more cooling fans 150.

Figure 2B:
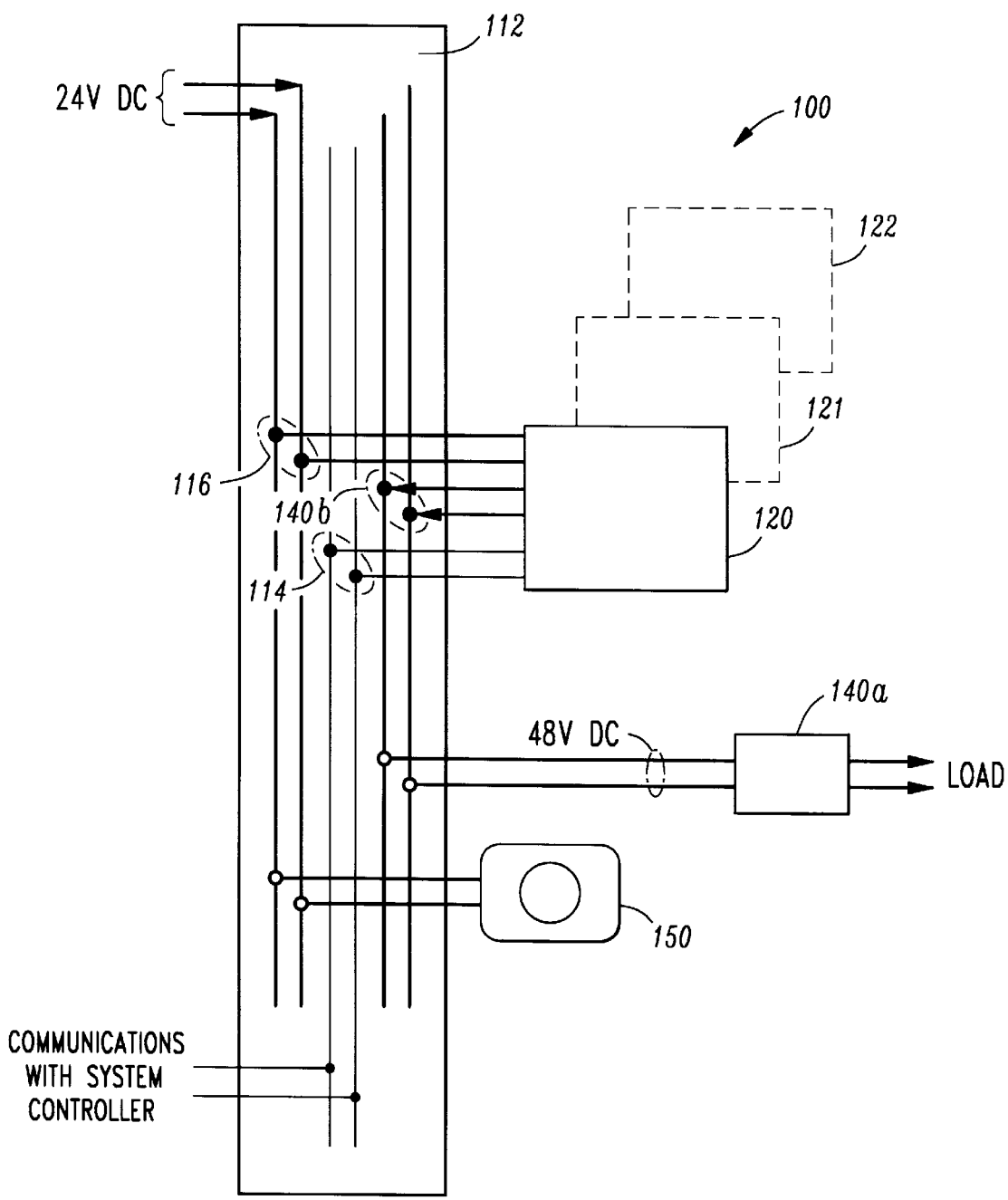
FIG. 2B illustrates a schematic block diagram of an alternative embodiment of the self-contained converter plant of FIG. 1 without the control card.

Referring now to FIG. 2B with continuing reference to FIGS. 1 and 2A, illustrated is a schematic block diagram of an alternative embodiment of the self-contained converter plant of FIG. 1 without the control card. In this embodiment, the function of the control card 130 of FIG. 1 is performed by a system controller (not shown) that communicates with the converter 120 via converter communications connector 114. The operation of the converter(s) 120, 121, 122, distribution panel 140a or direct connects 140b, and cooling fan(s) 150 remain as described in FIG. 2A.

Figure 3:
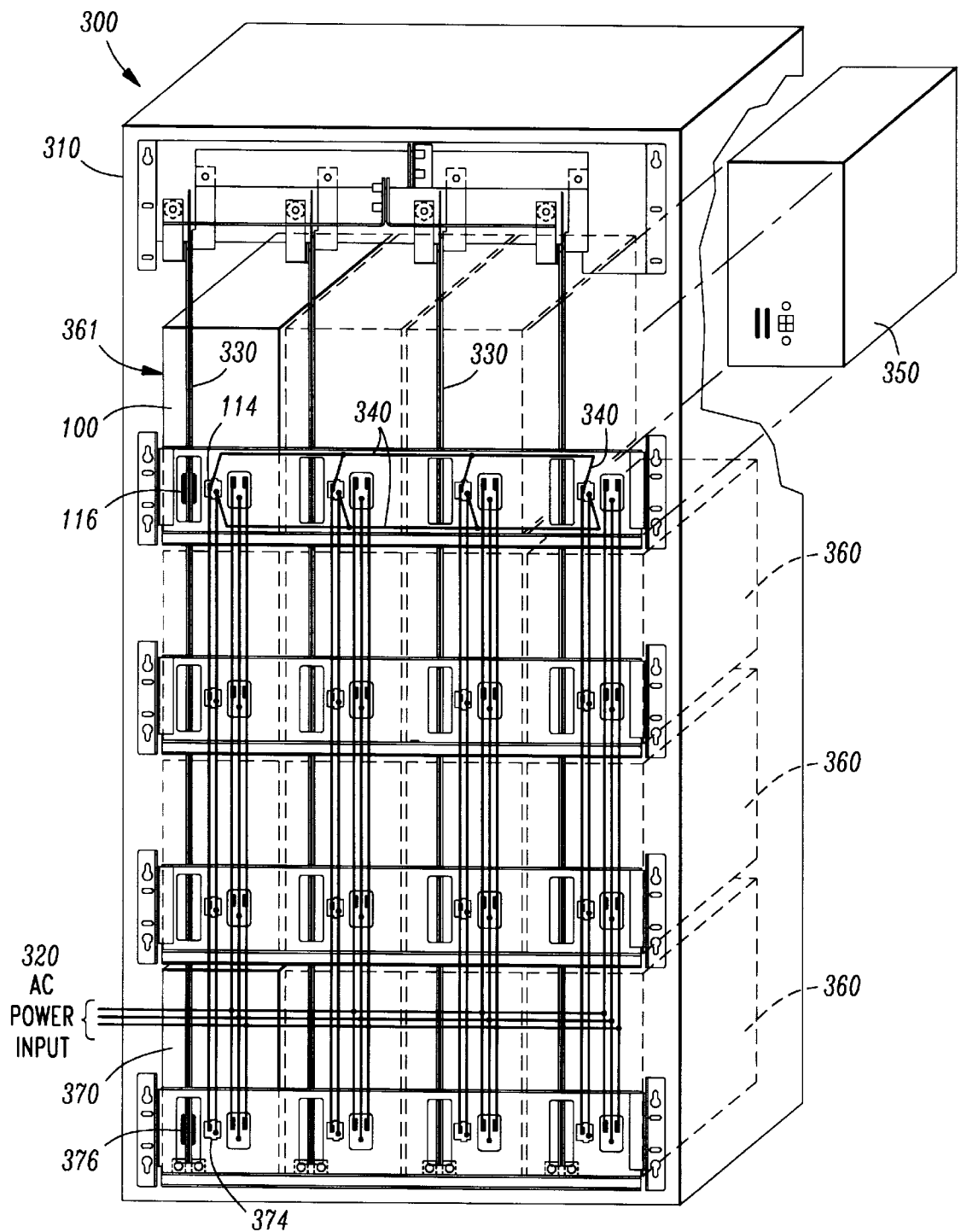
FIG. 3 illustrates an isometric view of one embodiment of a modular power supply system employing the self-contained converter plant of FIG. 1.

Referring now to FIG. 3 with continuing reference to FIG. 1, illustrated is an exploded isometric rear view of one embodiment of a modular power supply system employing the self-contained converter plant of FIG. 1. A modular power supply system 300 comprises a chassis or framework 310, an ac power input bus 320, a dc power distribution bus 330, a communications bus 340, a system controller 350, and the self-contained converter plant 100. The chassis 310 comprises power unit bays 360 configured to receive power units 370 that couple to the ac power input bus 320, the dc power distribution bus 330, and the communications bus 340. The power units 370 may be rectifiers, converters, or controllers. The power unit bays 360 may be populated with an appropriate number of rectifiers 370 to provide the required power output to the dc power distribution bus 330. In a preferred embodiment, commercial ac electrical power (120v, 208v or 240v) is supplied to the rectifiers 370 via the ac power input bus 320. The rectifiers 370 may output 24v dc power to the dc power distribution bus 330. The controller 350 monitors input power, output power, output load and power unit status and manages the modular power supply system 300. One who is skilled in the art is familiar with the operation of the modular power supply system 300.

In the illustrated embodiment, the self-contained converter plant 100 occupies one bay 361 of the chassis 310. A form factor of the housing 110 is substantially the same as a form factor of the rectifier 370, such that the self-contained converter plant 100 substantially occupies the volume of bay 361. As used herein the phrase "form factor" means the overall length×width×height+physical and electrical interconnectivity of the housing 110. That is, modules of the same form factor are physically interchangeable in a bay, even though they may perform different functions or be different devices, such as a rectifier, converter, or controller. One who is skilled in the art will recognize that the modules may differ in one or more dimensions while remaining interchangeable. The interconnectivity of the housing 110 may relate to the electrical connectivity of the housing with the modular power supply system 300, as well as the way in which the housing 110 physically connects with the modular power supply system 300. The rectifier module 370 includes a rectifier power output connector 376 that cooperatively engages the dc power distribution bus 330 and a rectifier communications connector 374 that cooperatively engages the communications bus 340. The self-contained converter plant 100 further includes a power input connector 116 that cooperatively engages the dc power distribution bus 330. The converter plant 100 also includes a converter communications connector 114 that cooperatively engages the communications bus 340. Therefore, the converter plant 100 is configured to automatically make the necessary electrical couplings to the communications bus 340 and to the dc power distribution bus 330 as the converter plant 100 is installed in the bay 361. It should be emphasized here that should a particular application require more than one converter plant 100, or no converter plant 100, that requirement may be satisfied by simply inserting or removing appropriate converter plants 100 in one or more bays 360. When inserted into the bay 361, the converter plant 100 couples the power input connector 116 to the dc power distribution bus 330, thereby providing input power to the converter 120. Likewise, the converter control card 130, through the converter communications connector 114, couples to the communications bus 340 whereby the converter control card 130 may coordinate converter 120 status with the system controller 350 and control the operation of the converter 120. Output power is routed from the converter 120 to the power distribution panel 140 where it may then be routed to a secondary load (not shown).

Thus, a self-contained converter plant 100 for use in a modular power supply system 300 has been described. In a preferred embodiment, the self-contained converter plant 100 performs power conversion and control while providing distribution of the converter 120 output. In a particularly advantageous embodiment, the converter plant housing 110 has a form factor substantially the same as that of rectifiers 370 used in the power supply system 300. Coupling of the converter 120 to the dc input power bus 330 and to the communications bus 340 is accomplished with connectors (116, 114 respectively) that substantially replicate the form to the connectors used on the rectifiers 370, enabling the converter plant 100 to directly supplant any rectifier 370. Being totally self-contained, the converter plant 100 may by simply inserted into a rectifier bay 360 and the secondary loads connected to the power distribution panel 140. Should the modular power supply system 300 requirements change, the converter plant 100 may be readily removed, replaced, or supplemented, as needed.

Although the present invention has been described in detail, those skilled in the art should understand that they can make various changes, substitutions and alterations herein without departing from the spirit and scope of the invention in its broadest form.

What is claimed is:

1. For use in a modular power supply system including a chassis having bays each configured to receive a power unit module therein, a power distribution bus, a communications bus and a controller, a self-contained converter plant, comprising:

a housing having a power input connector configured to engage an electrical power interface on said power distribution bus and a converter communications connector configured to engage a communications interface on said communications bus;

a converter contained in said housing; and a power distribution device electrically coupled to said converter.

2. The converter plant as recited in claim 1 further comprising a converter control card contained in said housing and electrically coupled to said converter and said converter communications connector.

3. The converter plant as recited in claim 1 wherein said converter is a dc to dc converter.

4. The converter plant as recited in claim 1 wherein a form factor of said housing substantially duplicates a form factor of said power unit module, thereby enabling said converter plant to substantially occupy one of said power unit bays.

5. The converter plant as recited in claim 4 wherein said electrical power interface on said power distribution bus includes a power connector and said communications interface on said communications bus includes a communications connector, said power input connector configured to cooperatively engage said power connector and said converter communications connector configured to cooperatively engage said communications connector.

6. The converter plant as recited in claim 1 wherein said converter is a step-up voltage converter or a step-down voltage converter.

7. The converter plant as recited in claim 1 further comprising a fan module configured to cool said converter.

8. A modular power supply system, comprising, a chassis having bays;

a power unit module configured to occupy one of said bays;

a power distribution bus;

a controller electrically coupled to a communications bus; and a self-contained converter plant, comprising:

a housing having a power input connector configured to engage an electrical power interface on said power distribution bus and a converter communications connector configured to engage a communications interface on said communications bus;

a converter contained in said housing; and a power distribution panel contained in said housing and electrically connected to said converter.

9. The modular power supply system as recited in claim 8 wherein said power unit module is selected from the group consisting of:

a rectifier module;

a converter module; and a controller module.

10. The modular power supply system as recited in claim 8 wherein said converter plant further comprises a converter control card contained in said housing and electrically coupled to said converter and said converter communications connector.

11. The modular power supply system as recited in claim 8 wherein said converter is a dc to dc converter.

12. The modular power supply system as recited in claim 8 wherein a form factor of said housing substantially duplicates a form factor of said power unit module, thereby enabling said converter plant to substantially occupy one of said bays.

13. The modular power supply system as recited in claim 12 wherein said electrical power interface on said power distribution bus includes a power connector and said communications interface on said communications bus includes a communications connector, said power input connector configured to cooperatively engage said power connector and said converter communications connector configured to cooperatively engage said communications connector.

14. The modular power supply system as recited in claim 8 wherein said converter is a step-up voltage converter or a step-down voltage converter.

15. The modular power supply system as recited in claim 8 further comprising a fan module configured to cool said converter.

16. A method of manufacturing a self-contained converter plant, comprising:

forming a housing having a backplane;

installing a power input connector and a converter communications connector on said backplane;

installing a converter in said housing and electrically coupling said power input connector to said converter; and installing a power distribution device in said housing, and electrically coupling said power distribution device to said converter.

17. The method as recited in claim 16 further comprising installing a converter control card in said housing, and electrically coupling said converter control card to said converter and said converter communications connector.

18. The method as recited in claim 16 wherein forming a housing includes forming a housing such that a form factor of said housing substantially duplicates a form factor of a power unit module, thereby enabling said housing to substantially occupy a power unit bay in a modular power supply system.

19. The method as recited in claim 16 wherein installing a power input connector and a converter communications connector includes:

installing a power input connector configured to cooperatively engage a power connector on a modular power supply system output bus; and installing a converter communications connector configured to cooperatively engage a communications connector on a modular power supply system communications bus.

20. The method as recited in claim 16 wherein installing a converter includes installing a voltage step-up converter or a voltage step-down converter.

21. The method as recited in claim 16 wherein installing a converter includes installing a fan module configured to cool said converter.

22. A method of manufacturing a modular power supply system, comprising:

forming a system chassis having bays configured to receive power unit modules;

installing a power input bus in said system chassis;

installing a communications bus in said system chassis;

installing a system controller in said system chassis, thereby electrically coupling said system controller to said communications bus;

installing a power unit module in at least one of said power unit bays, thereby electrically coupling said power unit module to said power input bus and said communications bus; and installing a self-contained converter plant in at least one of said power unit bays, thereby electrically coupling said self-contained converter plant to said power input bus and said communications bus.

23. The method as recited in claim 22 wherein installing a self-contained converter plant includes installing a converter plant of a physical form factor substantially duplicating a physical form factor of said power unit module thereby enabling said converter plant to substantially occupy at least one of said power unit bays.

24. The method as recited in claim 22 wherein installing a self-contained converter plant includes installing a self-contained dc to dc power converter plant.

25. The method as recited in claim 22 further comprising installing an electrical coupler between said input power bus and a commercial ac power source.

* * * * *